United States Patent
H et al.

(10) Patent No.: US 9,869,718 B1
(45) Date of Patent: Jan. 16, 2018

(54) SCAN TEST ARCHITECTURE AND METHOD FOR SCAN TESTING

(71) Applicant: Microsemi Solutions (U.S.), Inc., Aliso Viejo, CA (US)

(72) Inventors: Hanumantharaya H, Bangalore (IN); Yasushi Takenaka, Burnaby (CA)

(73) Assignee: MICROSEMI SOLUTIONS (U.S.), INC., Alison Viejo, CA (US)

( * ) Notice: Subject to any disclaimer, the term of this patent is extended or adjusted under 35 U.S.C. 154(b) by 11 days.

(21) Appl. No.: 14/871,200

(22) Filed: Sep. 30, 2015

(51) Int. Cl.
  *G01R 31/28* (2006.01)
  *G01R 31/3177* (2006.01)

(52) U.S. Cl.
  CPC .............................. *G01R 31/3177* (2013.01)

(58) Field of Classification Search
  None
  See application file for complete search history.

(56) References Cited

U.S. PATENT DOCUMENTS

| | | | | |
|---|---|---|---|---|
| 6,249,893 B1 * | 6/2001 | Rajsuman | ...... | G01R 31/318385 714/738 |
| 6,510,530 B1 * | 1/2003 | Wu | ........ | G11C 29/12 714/30 |
| 6,563,751 B1 * | 5/2003 | Wu | ........ | G11C 29/14 365/201 |
| 7,203,873 B1 * | 4/2007 | Adams | ............ | G11C 29/1201 714/31 |
| 2004/0123203 A1 * | 6/2004 | Nadeau-Dostie | .... | G11C 29/025 714/736 |
| 2005/0041460 A1 * | 2/2005 | Vinke | ............ | G11C 29/48 365/154 |
| 2009/0245000 A1 * | 10/2009 | Anzou | ............ | G11C 29/02 365/201 |
| 2015/0262709 A1 * | 9/2015 | Anzou | ............ | G11C 29/4401 365/189.07 |

* cited by examiner

*Primary Examiner* — Daniel McMahon
(74) *Attorney, Agent, or Firm* — Leber IP Law; Dennis R. Haszko

(57) ABSTRACT

A circuit and a method for testing for faults in a circuit path. The circuit comprises a memory, a collar flop connected in parallel with the memory, and a feedback path in communication with the output of the memory and the input of the collar flop. The method comprises applying a fault test vector to logic in the circuit path to produce a fault test vector response, propagating the vector or the response through a memory in the circuit path, and capturing the response in a collar flop.

19 Claims, 6 Drawing Sheets

SCAN TEST ARCHITECTURE AND METHOD FOR SCAN TESTING

FIELD

The present disclosure relates to scan testing of integrated circuits.

BACKGROUND

Scan testing integrated circuits (ICs, also referred to herein as chips and circuits), comprises applying fault test vectors to a path in the circuit (circuit path) to identify manufacturing defects (also called faults) in the circuit path. A fault test vector is a pattern of logical '1' and '0' values. Applying the fault test vectors to the circuit path comprises: loading the vectors in flip flops in communication with combinational logical (e.g. logical gates) in the path to be tested; allowing the combinational logic being targeted for testing by the specific fault test vectors to perform operations on the vector values to produce fault test vector responses (also referred to as sensitizing the logic); propagating the responses through downstream combinational logic, capturing the responses in flip flops; shifting the responses out of the flip flops; then analyzing the responses to identify the defects and their locations. The flip flops are only included in the circuit for the purpose of scan testing.

Stuck-at-faults and transition delay faults are two types of faults which can be tested by the Stuck-at-Fault (SAF) and Transition Delay Fault (TF) scan testing models, respectively. These models are widely used for identifying defects in an IC. The SAF model detects hard defects, such as signals shorted to VDD/GND. The TF model detects delayed signals indicating resistive circuit paths. In the SAF model, the logic in the path (which can include circuit nodes and gates connected through wires) are assumed to be stuck at either logical '1' or '0' values. Fault test vectors are generated to test the assumptions, and the vectors are applied on the manufactured IC to detect and isolate the defective logic. In the TF model, fault test vectors are generated to test for propagation delays in the logic along the capture path. Propagation delays may be caused by, for example, resistive opens, shorts or process variations, etc. which play a vital role in proper functioning of the chip at the functional rated frequencies.

Commercial electronic design automation (EDA) tools typically generate the fault test vectors. Many fault test vectors may need to be generated to achieve a particular test coverage. Coverage refers to the portion of elements in the circuit path under test which are actually tested for faults. It may not be feasible or even possible to achieve full test coverage of a path because it is too difficult or not possible to generate all of the fault test vectors to do so, especially where the circuit path under test comprises a memory. This is because propagating a fault test vector or fault test response through a memory requires writing to and reading from the memory. But high SAF and TF coverage is desirable to ensure that quality chips are shipped to end customers.

A bypass path comprising a collar flop connected in parallel with the memory has been used to exclude the memory from the test path. But using the collar flop to exclude the memory from the test path prevents testing for timing delay faults caused by the memory. The bypass path and collar flop also inadvertently exclude memory boundary logic from testing. This is undesirable since it ultimately decreases the fault test coverage of the path under test.

In short, it is difficult to achieve good fault test coverage for a circuit comprising a memory because bypassing the memory in scan tests using a collar flop also bypasses certain of the memory boundary logic, and also fails to account for timing delays caused by the memory, but including the memory in scan tests makes it difficult to generate fault test vectors that can sensitize all of the logic in the path under test.

DETAILED DESCRIPTION

Figure 1:
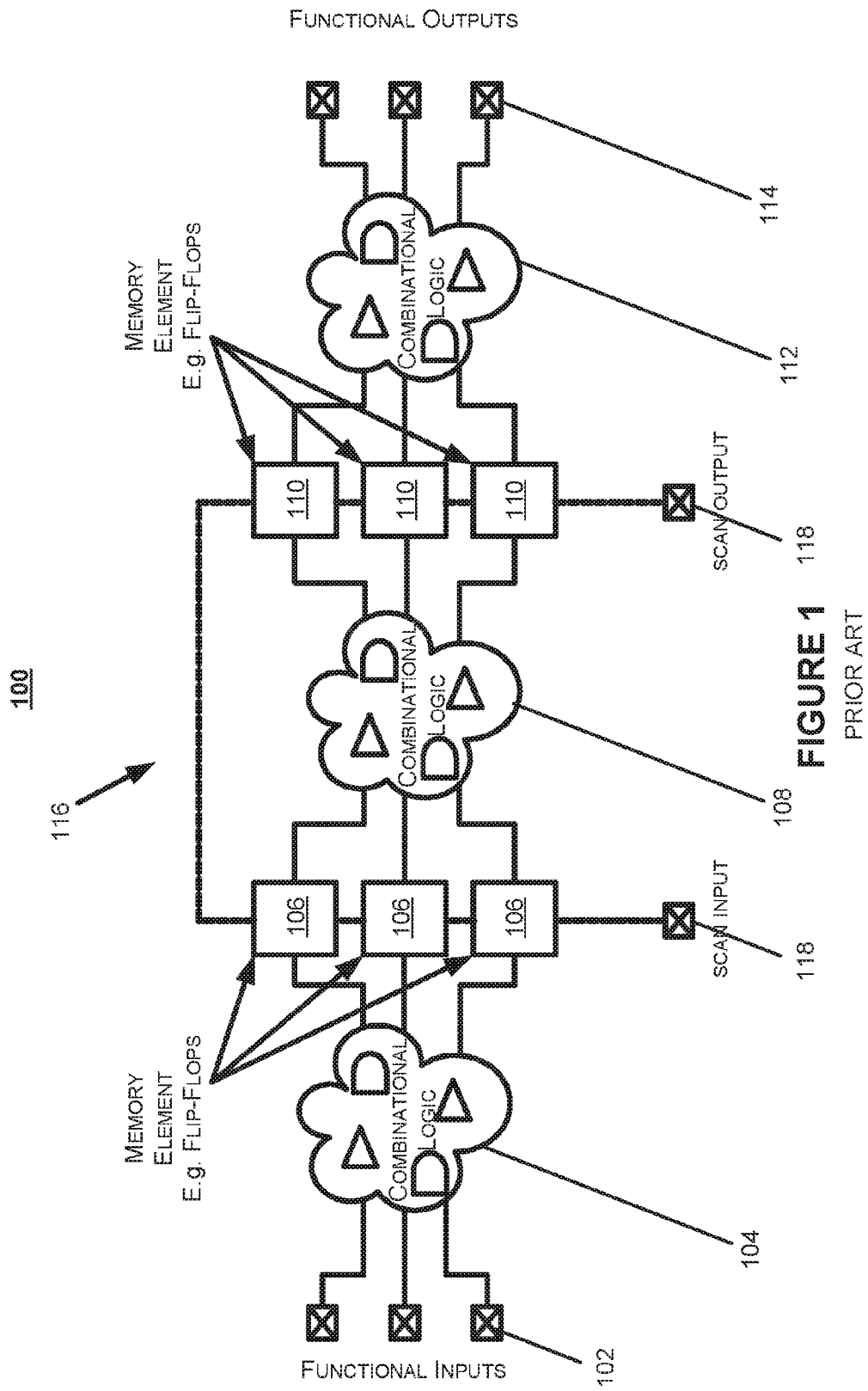
FIG. 1 shows a conventional scan test architecture.

The present disclosure describes a scan test architecture, circuit, and method for improving the fault test coverage of circuits comprising a memory. The memory may be an SRAM memory, register file, a test-wrapped memory, or any other logic that is sequential in nature, can store data, and which causes fault testability issues. In accordance with an embodiment of the present disclosure, the output of the memory is connected by a feedback path to the input of a collar flop. The feedback path propagates data from the memory to the collar flop for capture, making it feasible to test the memory and memory boundary logic for faults. The present disclosure describes using the collar flop (which is standardly included in IC designs to exclude the memory and certain memory boundary logic from testing) to actually include the memory and the memory boundary logic in fault tests to improve fault test coverage. In accordance with an embodiment of the present disclosure, memory boundary logic, which would otherwise be excluded from testing if a bypass path comprising the collar flop were used, may be tested for faults. Furthermore, by using the collar flop, responses from memory boundary logic tests are not propagated through the combinational logic after the memory. This helps simplify generating fault test vectors and, in turn, helps to further increase the fault test coverage of the memory boundary logic. Furthermore, since collar flops are typically included in IC designs comprising a memory expensive, area-intensive logic element do not need to be added to the design.

In accordance with an embodiment of the present disclosure a circuit may comprise: a memory comprising a memory input and a memory output; a collar flop in communication with the memory input and the memory output; and a feedback path in communication with the memory output and an input of the collar flop, the collar flop configured to capture, from the feedback path, a fault test vector response. The circuit may further comprise an exclusive-or (XOR) gate configured to aggregate, for input into the collar flop, data received at the memory input with the fault test vector response in the feedback path. The circuit may further comprise memory boundary logic in communication with the memory. The collar flop may be configured to capture the fault test vector response resulting from the memory boundary logic performing operations on a fault test vector. The memory boundary logic may comprise at least one of first combinational logic configured to control the memory, second combinational logic configured to encode data received by the memory, third combinational logic configured to decode data from the memory, a memory input port, and a memory output port. The memory boundary logic may comprise a first multiplexor (MUX) configured to select between the memory output and an output of the collar flop, and wherein an output of the first MUX is in communication with the feedback path. The memory boundary logic may comprise a first MUX and a second MUX, each of the first and second MUXes configured to select between the memory output and the output of the collar flop; the feedback path may comprise a first and second feedback path; the output of the first MUX may be connected to the first feedback path; and the output of the second MUX may be connected to the second feedback path. The memory may comprise a plurality of memories, and wherein the memory boundary logic comprises combinational logic configured to decode the output of the plurality of memories. The fault test vector response may be a stuck-at fault response or a transition fault response. The memory may comprise two memories connected back-to-back. The circuit may further comprise upstream combinational logic in communication with the memory input, and downstream combinational logic in communication with the memory output. The memory may comprise a static random access memory (SRAM) or a test-wrapped memory. The circuit may further comprise an AND gate between the memory input and the XOR gate, the AND gate configured to cause the fault test vector response to propagate through the feedback path.

In accordance with another embodiment of the present disclosure a method for testing for a fault in a circuit may comprise: applying a fault test vector to a logic in the circuit to produce a fault test vector response, propagating the fault test vector or the fault test vector response through a memory in the circuit; capturing the fault test vector response in a collar flop, the collar flop in communication with an input and an output of the memory; shifting the fault test vector response out of the collar flop; and comparing the fault test vector response to an ideal response to identify a fault. Propagating the fault test vector or fault test vector response through the memory may comprise writing the vector or response into the memory, and reading the vector or response from the memory. When the logic is upstream from the memory, the fault test vector response may be propagated through the memory. When the logic is downstream from the memory, the fault test vector may be propagated through the memory. The fault test vector may be a stuck-at-fault test vector or a transition-fault test vector. The logic may be sensitized at an operational speed. The fault test vector response may be produced in response to applying the fault test vector to memory boundary logic.

FIG. 1 shows a conventional scan test architecture in an IC 100. Combinational logic 102,108, 112 within the IC 100 is driven by either functional inputs 102, or sequential elements 106,110. The sequential elements 106, 110 are memory elements such as flip-flops or static random access memories (SRAMs). In the scan test architecture, flip-flops (but not other types of memory) are linked together and configured as serial shift-registers called "scan chains" 116 to obtain "controllability" on the combinational logic. To perform scan tests, a scan chain 116 loads fault test vectors, through scan input pins 118, to test (sensitize) the corresponding combinational logic 104, 108, 112 for defects. The scan test comprises loading scan flip-flops 106, which are upstream from the combinational logic to be tested 108, with fault test vectors, then applying a functional capture pulse to sensitize the combinational logic 108 and to capture the fault test vector response (response) in flip flops 110 downstream from the combinational logic 112. The response is then shifted out through scan output pins 118 using the scan chain 116. Capturing the response and shifting it out of the IC is referred to as "observability."

Figure 2:
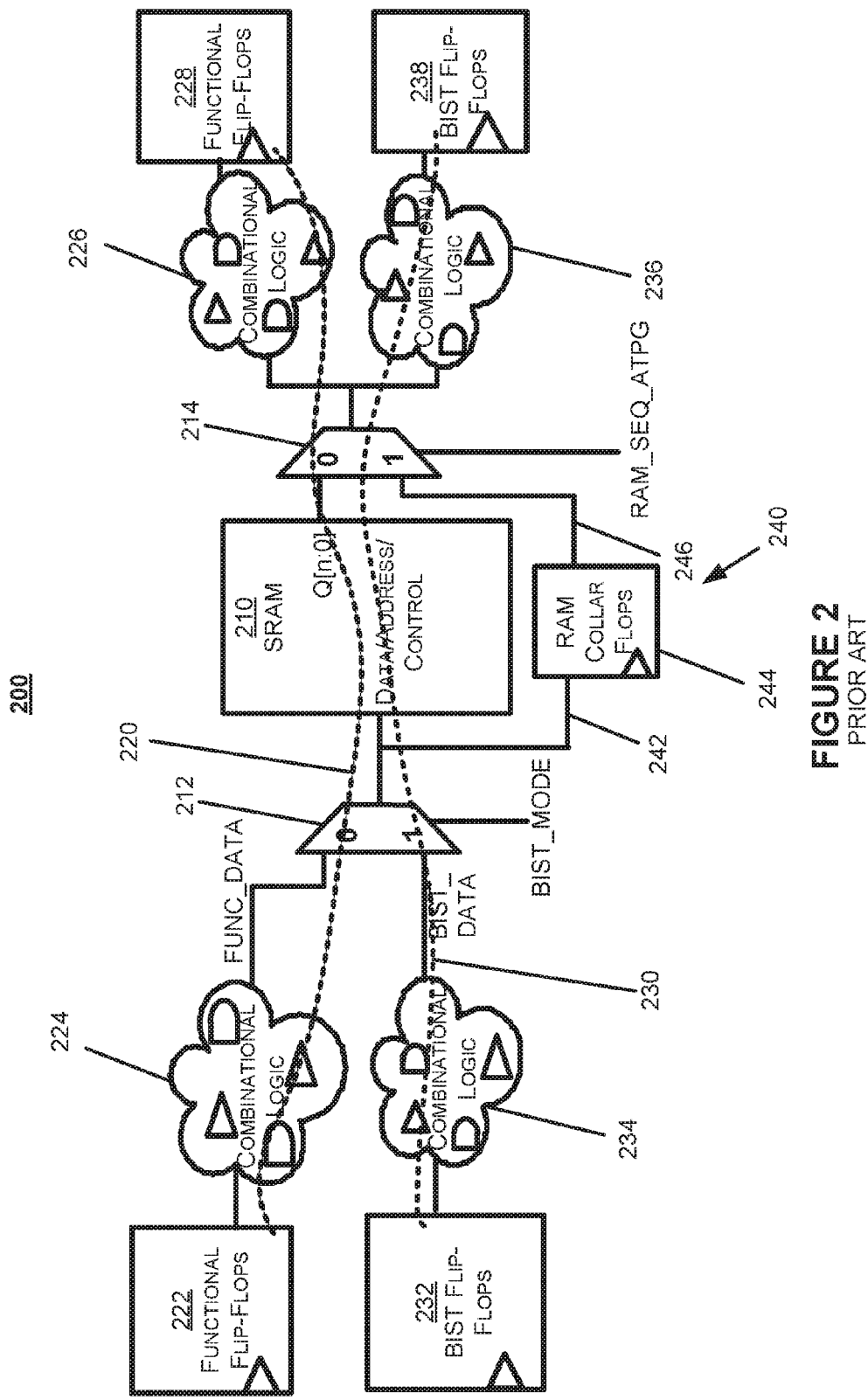
FIG. 2 shows a conventional scan test architecture comprising a memory.

FIG. 2 shows a conventional scan test architecture circuit 200 comprising an SRAM memory 210, and a functional circuit path 220 and a built-in self test (BIST) circuit path 230. Embedded memories are typically dense physical structures making them more sensitive to coupling defects and thus requiring tests having a string of write/read operations. BIST architecture was developed to help reduce the complexity and cost of accessing and testing embedded memories using automatic test equipment (ATE). The circuit paths 220, 230 share the memory 210, BIST multiplexors (MUXes) 212, and bypass MUXes 214.

Each of the circuit paths 220, 230 comprises, respectively, upstream flip-flops 222,232, upstream combinational logic 224,234, downstream combinational logic 226,236, and downstream flip-flops 228,238. The upstream flip-flops 222, 232 and downstream flip-flops 228,238 are connected together, respectively, to form scan chains.

The circuit 200 also comprises a memory bypass path 240 in parallel with the memory 210 to facilitate conducting fault tests on the combinational logic 224,234,226,236 by excluding the memory 210 from the circuit path 220 under test. The bypass path 240 comprises a first net 242 (which is any electrical connection) connecting the input of the memory 210 to the input of collar flops 244, and a second net 246 connecting the output of the collar flops 244 with bypass MUXes 214. In this way, the collar flops 244 are connected in parallel with the memory 210. The bypass MUXes 214 select between the memory 210 and the bypass path 240. Collar flops 244 are typically included in most ICs to bypass a memory for conducting fault tests. This is because it is difficult to generate fault test vectors that can accommodate the memory 210 as part of the vector and in the circuit path under test. The bypass path 240 may comprise all of the elements required to circumvent the memory 210 including the collar flops 244, nets connecting the collar flops 244 to the inputs and outputs of the memory 210, and bypass MUXes 214.

Using the bypass path 240 for testing, however, excludes logic from testing such as, for example, the SRAM input and output ports, and the '0' input on the bypass MUXes 214. Typically, the logic that is excluded from testing when using the bypass path 240 is the logic at the boundary or periphery of the memory 210. Other types of logic that may be excluded from testing includes combinational logic for controlling the memory 210, combinational logic for encoding data to and decoding data from the memory, multiplexors for selecting between data going into and coming out of the memory (generally referred to as memory boundary logic). Furthermore, bypassing the memory 210, and using only the collar flops 240 in TF tests, does not account for timing delays that may be caused by the memory 210. It is desirable to test the memory boundary logic and memory for faults, however, to achieve the highest feasible fault test coverage for the circuit path 202 that would be used during actual operation, and to effectively grade/bin circuits according to performance/speed that would actually be experienced during operation.

RAM sequential scan testing can be used to include the memory 210 and memory boundary logic in fault tests. In RAM sequential scan testing, specific fault test vectors are, in addition to sensitizing for faults, generated to write to and read from the memory 210 to propagate fault test vectors and responses through the memory. Notwithstanding, a large number of faults on the memory boundary logic (such as faults on SRAM ports and MUX pins) may still remain untestable. This is because deep combinational logic before and after the memory 210, and the read and write operations for the memory itself, make it difficult for the ATPG tools to generate fault test vectors which can sensitize for faults on the memory interface path, and the results of which can propagate through the deep downstream combinational logic 226,236 to the downstream flip flops 228,238 for capture, output and analysis. Due to the sequence of fault sensitization, memory write, memory read and response propagation in ATPG tools, testing of SRAM interface faults results in multiple scan loads. The deep combinational logic may be due to product requirements (such as soft repair logic on the memory interface path) or design constraints (such as using smaller memories and control logic to create larger memories with faster access time and power dissipation). RAM sequential scan testing is used in combination with the fault tests that use the memory bypass logic to provide better fault test coverage of the circuit path.

Due to the nature of the Launch-off-Capture (LoC) test method, it is also difficult to generate TF fault test vectors the responses of which can propagate through the memory 210 and deep combinational logic. Since LoC vectors must launch a transition from the functional path and not the shift path, each test comprises a first fault test vector for initializing the logic, and a second fault test vector for transitioning the logic to the another value.

In short, it is difficult to achieve good fault test coverage for memory boundary logic because bypassing the memory in scan tests using a collar flop also bypasses certain of the memory boundary logic, and also fails to account for timing delays caused by the memory, but including the memory in scan tests (using the RAM sequential scan testing method) makes it difficult to generate fault test vectors that can sensitize the memory boundary logic for faults.

Figure 3:
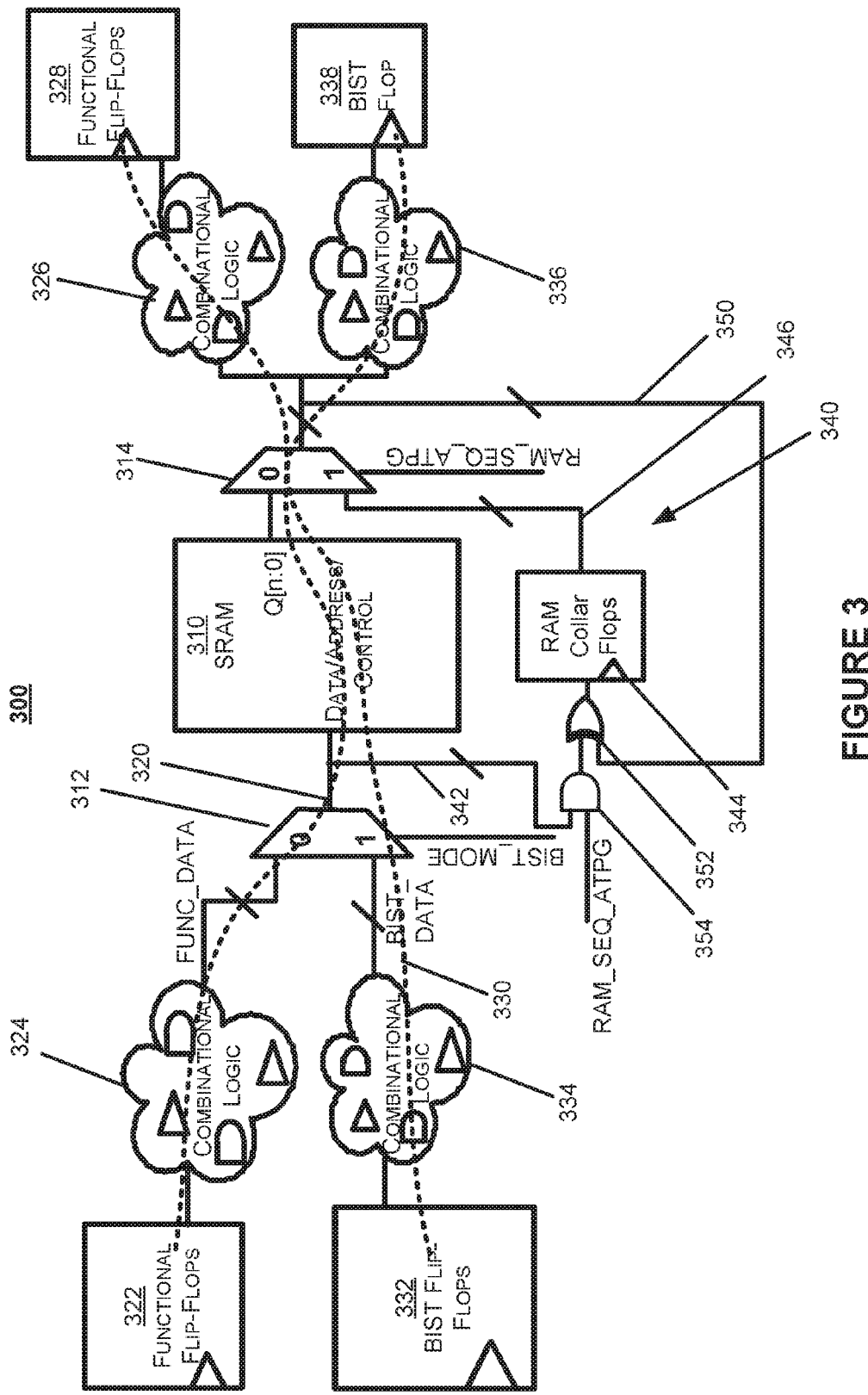
FIG. 3 shows a scan test architecture for a circuit comprising a memory in accordance with an embodiment of the present disclosure.

FIG. 3 shows a scan test architecture for a circuit 300 comprising a memory 310 in accordance with an embodiment of the present disclosure. The circuit 300 comprises a functional circuit path 320 and a BIST circuit path 330 comprising logic to be tested for faults (sensitized). Each circuit path 320, 330 is 'n' bits wide and comprises upstream flip flops 322,332 for loading fault test vectors, upstream combinational logic 324, 334, downstream combinational logic 326, 336 and downstream flip-flops 328, 338 to capture fault test vector responses. Although the figures and description of the present disclosure may show or refer to a single logic element such as a flip-flop or a multiplexor, there may be a plurality of logic elements in parallel with one-another forming a group. A flip-flop can only accommodate a single bit, whereas the bit width of a line in a circuit may be more than 1 bit. The number of logic elements in parallel may depend on the number of bit lines the logical element is required to handle in parallel.

Both circuit paths 320,330 share a memory 310 in communication with memory boundary logic. The memory boundary logic may include, but is not limited to, combinational logic for controlling the memory, combinational logic for encoding data to and decoding data from the memory, memory input ports, memory output ports, multiplexors (or portions thereof) for selecting between data going into the memory and data coming out of the memory. FIG. 3 shows BIST MUXes 312 selecting between BIST data and functional data. The memory 310 comprises memory inputs and memory outputs. The memory inputs and memory outputs may be any point on the nets leading into and out of the memory 310, respectively, even where such points are separated from the actual memory 310 by memory boundary logic.

The circuit 300 also comprises collar flops 344 connected in parallel with the memory 310 so that the collar flops 344 are in communication with the memory inputs and the memory outputs. The collar flops 344 may also be referred to as bypass flops. The collar flops 310 and associated connections or nets 342, 346 are configured to provide a bypass path 340 to permit fault test vectors and fault test vector responses to propagate around the memory 310, and memory boundary logic, if any. The memory boundary logic may reside between the memory 310 and the nets 342, 346. The collar flops 340 are connected to nets in communication with the memory inputs and outputs. Bypass MUXes 314 select between data from the memory 310 and the collar flop 344. The outputs of the bypass MUXes 314 are connected to the downstream combinational logic 326 336.

In accordance with an embodiment of the present disclosure, the circuit 300 also comprises a feedback path 350 in communication with the memory outputs and the inputs of the collar flops 310. The feedback path 350 may comprise a net connected to the outputs of the bypass MUXes 314 and the inputs of exclusive-or gates 352. The outputs of BIST MUXes 312 (or memory inputs) are also connected to the inputs of the exclusive-or gates 352. The outputs of the exclusive-or gates 352 are connected to the inputs of the collar flops 344. The exclusive-or gates 352 aggregate, for capture by the collar flops 344, the data received at the memory input with the data on the feedback path 350 (which is the fault test vector response provided by the logic being tested). The number of data lines (the data width) of the feedback path 350 corresponds to the data width of the memory output. There may be at least one collar flop 344 for each data line of the feedback path 350.

In accordance with an embodiment, the feedback path 350 propagates fault test responses to the collar flops 344. The path through which the faults test responses propagate after the memory 310 is not the remainder of the circuit paths 320, 330. By capturing responses in the collar flops 344, there is no need to propagate the responses through the downstream combinational logic 326, 336 thereby simplifying the generation of fault test vectors. In other words, feeding back responses via the feedback path 350 to the 8collar flops 344 allows the memory 310 and associated memory boundary logic to be included in the circuit path 320, 330 when scan testing for faults.

Whether it is a fault test vector or a fault test vector response which passes through the memory 310 depends upon which logic of the circuit path 320, 330 is being targeted for testing. In an embodiment, memory boundary logic after the memory, such as the '0' input port on the bypass MUXes 318, may be targeted for testing in which case the fault test vectors pass through the memory 310. In another embodiment, where boundary logic before the memory 310 is targeted for testing, the fault test responses pass through the memory 310 and are propagated via the feedback path 350 to the collar flops 344.

Since the memory 310 is part of the circuit path 320, 330, fault test vectors or fault test vector responses are written to a particular address of the memory with a write operation, then read from the memory at the particular address with a read operation. The fault test vectors or responses are then read out of the memory 310 and propagated to the collar flops 344 via the feedback path 350. Reading and writing the vectors and responses to the memory uses the same method as in RAM sequential scan testing.

The feedback path 350 permits the memory 310 and associated memory boundary logic to be included in the circuit paths 320, 330 under test by avoiding having the responses propagate through the downstream combinational logic 326, 336 and instead capturing the responses in the collar flops 344. Including the memory 310 as part of the circuit paths 320, 330 under test improves the test coverage of the circuit path 320, 330. That portion of the memory boundary logic, which would have otherwise been excluded from testing when using the bypass path 340, now has the opportunity to be tested for faults. Avoiding propagating responses through the downstream combinational logic 326, 336 also reduces the computational effort of ATPG tools to generate fault test vectors by reducing the number of care-bits (the bit locations in the fault test vector which must be set to a particular value to test a certain portion of logic) required in the vectors. This, in turn, may permit generation of more fault test vectors which cover more potential faults on the memory boundary logic. In other words, the universe of fault test vectors which can be used for scan testing is no longer limited to only vectors which generate responses that can successfully propagate through the downstream combinational logic 326, 336. This is beneficial since higher fault coverage helps reduce the number of defective parts per million (DPPM).

The feedback path 350 also helps improve the quality of at-speed TF coverage by including the memory 310 in the circuit paths 320, 330 under test. When testing a transition fault at the memory 310 input on the circuit path, the manner in which the memory 310 is read is immaterial. This is because writing to the memory 310 is always faster and at a higher frequency than reading from the memory 310. In an embodiment, TF fault test vectors are applied to combinational logic in the circuit path to produce responses. The responses are written into the memory 310, then read from the memory 310, fed back via the feedback path 350, aggregated with other data going into the input of the exclusive-or gates 352, and captured by the collar flops 344. Fault test vectors or response are written to and read from the memory using the same process as in RAM sequential scan testing. The responses are then shifted out of the collar flops 344 for comparing against simulated responses (also referred to as ideal responses or expected responses) to identify the TFs, if any. The simulated response is determined by the ATPG tool based on the assumption that the logic under test contains no faults. Including the memory 310 in the circuit path for TF tests helps to deterministically speed grade or voltage bin chips by segregating them according to the speed which would likely be experienced during normal operations since those operations would typically involve writing to and reading from the memory 310.

No modification to ATPG tools is required to take advantage of the feedback path 350. ATPG tools automatically attempt to locate the shortest path to capture the fault test response. Upon detecting a connection from the memory 310 to the collar flops 344, the ATPG tool would automatically attempt to generate fault test vectors which capture the responses in the collar flops 344. An AND gate 354 may be added between the memory input and the collar flap 344 to cause the ATPG tool to generate fault test vectors which, or which their responses, propagate through the memory 310 and through feedback path 350, and inhibit the ATPG tool from generating fault test vectors which propagate through the bypass path 340. The RAM_SEQ_ATPG input on the bypass MUX 314 is controlled by a signal from a jtag.

Figure 4:
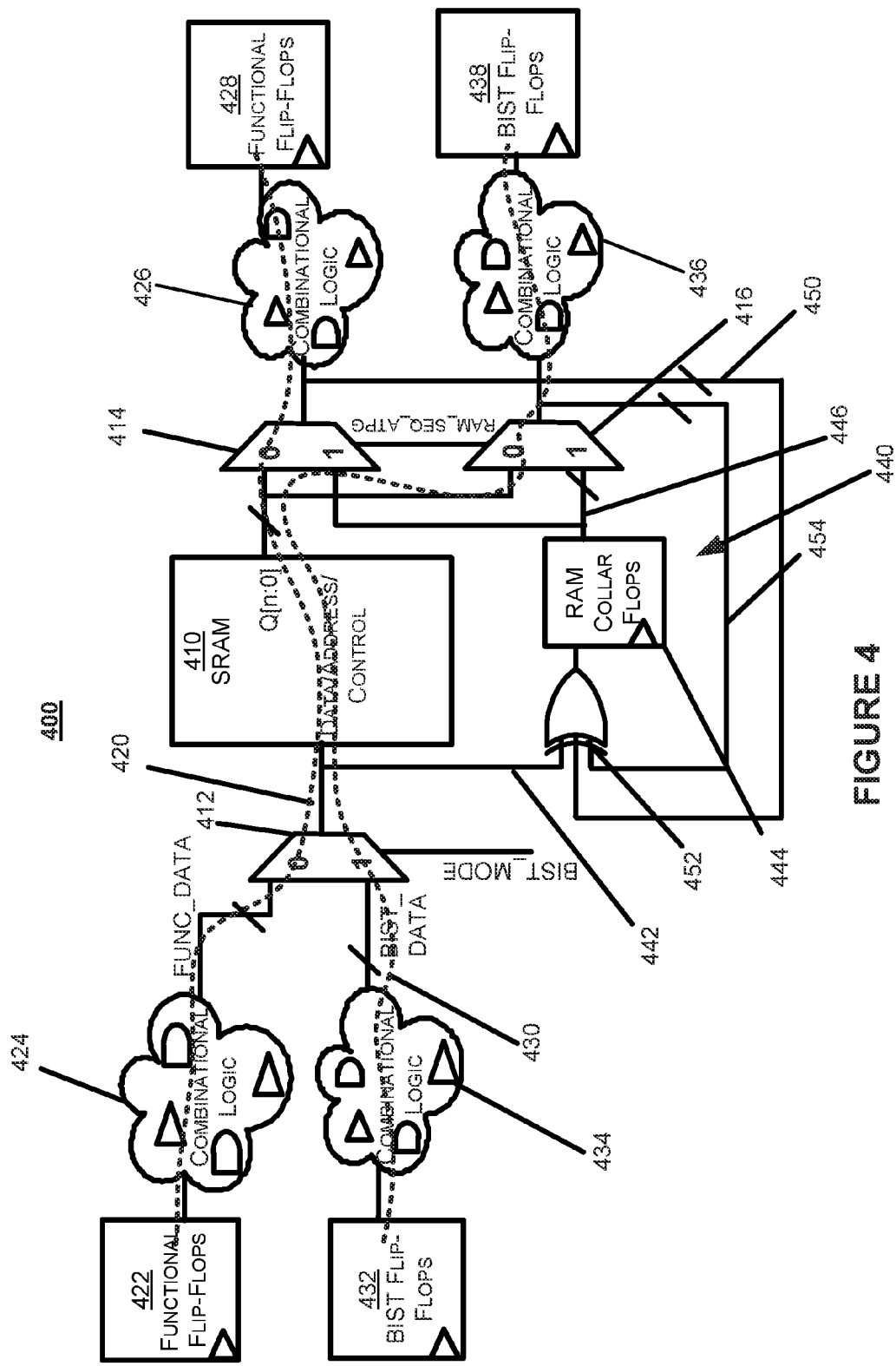
FIG. 4 shows a scan test architecture for a circuit comprising a memory in accordance with another embodiment of the present disclosure.

FIG. 4 shows a scan test architecture for a circuit 400 comprising a memory 410 in accordance with another embodiment of the present disclosure. The memory 410 is an SRAM. The circuit 400 comprises a functional circuit path 420, and a BIST circuit path 430, to be tested for faults (sensitized). Each circuit path 420, 430 is 'n' bits wide and comprises upstream flip flops 422,432 for loading fault test vectors, upstream combinational logic 424, 434, downstream combinational logic 426, 436 and downstream flip-flops 428, 438. A BIST MUX 412 selects between BIST data and functional data.

The circuit 400 also comprises a bypass path 440 comprising collar flops 444 connected in parallel with the memory 410. Similar to FIG. 3, the collar flops 444 and associated connections or nets 442, 446 are configured to provide the bypass path 440 for fault test vectors and responses to propagate around the memory 410. The collar flops 444 are connected to nets in communication with the memory 410 inputs and outputs.

Scan test architectures typically have a single group of bypass MUXes 414 to select between the bypass path 440 or the memory 410. In such designs, when the memory 410 is selected, the bypass MUXes 414 may forward data from either of the functional circuit path 420 or the BIST circuit path 430. Distant downstream BIST combinational logic, however, may impact the timing for the functional-memory interface due to routing length. This is because if the same wire connected the downstream functional combination logic and the downstream BIST combinational logic to the bypass MUXes, and, but the downstream BIST combinational logic is faster than the downstream functional combinational logic 226, then the loading is greater. In other words, the length of the wire connecting the MUXES and downstream logic defines the timing for the functional-memory interface.

A second group of BIST MUXes 416 may be added using logic cloning to separate the functional circuit path 420 from the BIST circuit path 430. In logic cloning, multiple fanout logic is broken into separate logic cones with identical structures. The faults on the inputs of the BIST MUXes 416, which are driven by the memory output, however, would be untestable due to the downstream BIST combinational logic for reasons similar to those described in relation to FIG. 3.

In accordance with an embodiment of the present disclosure, the circuit 400 comprises two feedback paths: a first feedback path 450 (also referred to as a functional feedback path) connecting the outputs of the first group of bypass MUXes 414 to the collar flops 444 via the exclusive-or gate 452; and a second feedback path 454 (also referred to as a BIST feedback path) connecting the outputs of the second group of BIST MUXes 416 to the collar flops 444 via the exclusive-or gate 452. The first feedback path 450 and the second feedback path 454 avoid having to propagate fault test vector responses through downstream functional and BIST combinational logic, respectively.

Figure 5:
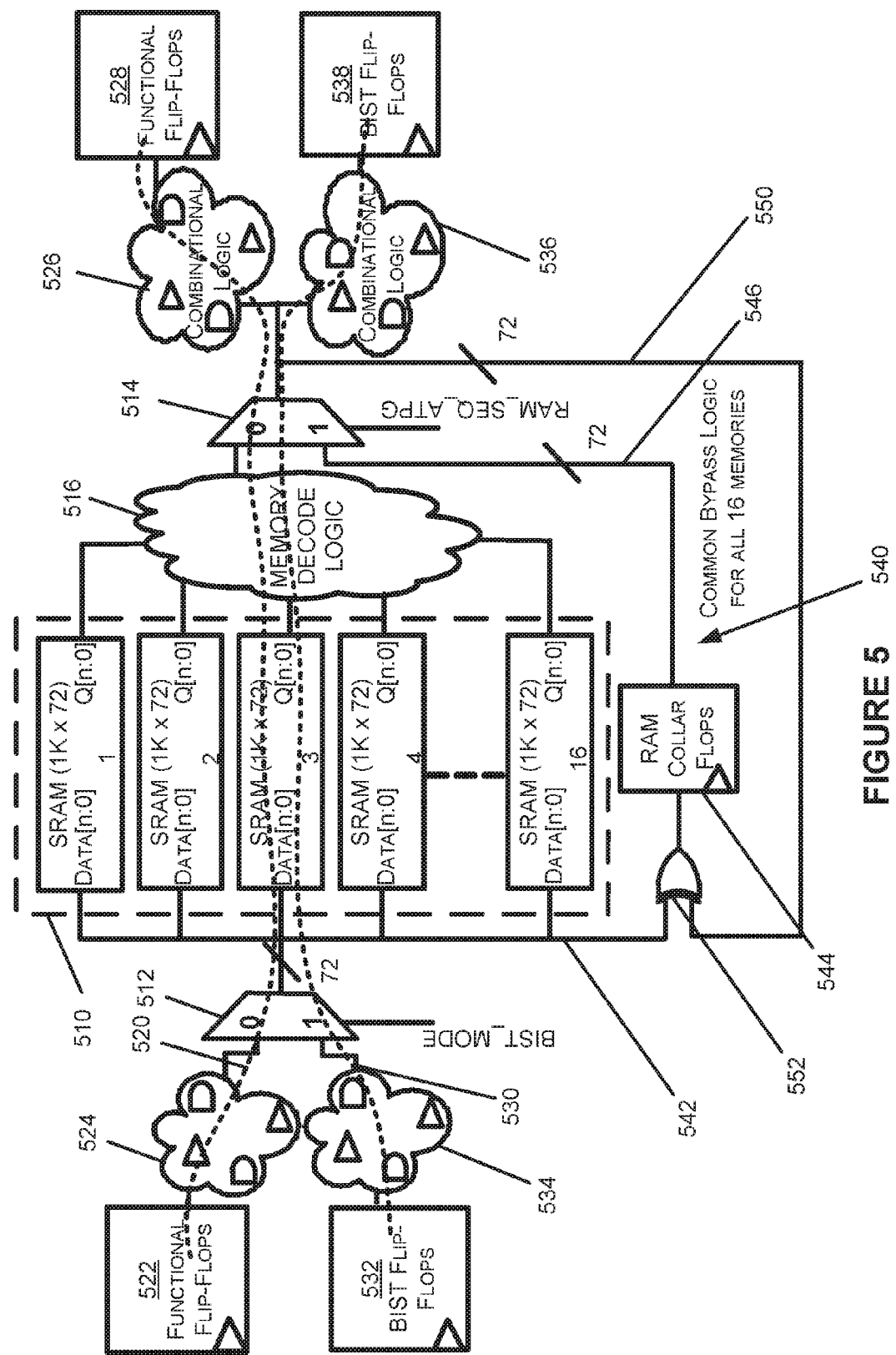
FIG. 5 shows a scan test architecture for a circuit comprising a plurality of memories in accordance with another embodiment of the present disclosure.

FIG. 5 shows a scan test architecture for a circuit 500 comprising a large SRAM memory 510 composed of a plurality of smaller SRAM memories in accordance with another embodiment of the present disclosure. Multiple smaller SRAMs may be used to build a deeper/wider single SRAM due to the ready availability of design models for smaller SRAMs. Smaller SRAMs are also faster, cheaper and require less power.

Similar to the circuit 300 of FIG. 3, the circuit 500 comprises a functional circuit path 520 and a BIST circuit path 530. The circuit paths 520,530 each comprise upstream flip-flops 522,532, upstream combinational logic 524,534, downstream combinational logic 526,536, and downstream flip-flops 528,538.

The memory 510 is 16 KB in size and has 17 inputs. The memory 510 comprises 16 smaller SRAMs, each of the smaller SRAMs being 1 KB in size and having 72 inputs. The smaller 1 KB SRAMs each have 1024 address locations and require 10 address bits to access all address locations. The large 16 KB SRAM has 16384 address locations and requires 14 address bits to access all address locations. The lower 10 of the 17 address bits are connected to the address bits of the 16 smaller SRAMs, and the upper 4 of the 17 address bits are used to select between one of the 16 SRAMs.

The circuit 500 also comprises decode logic 516 connected to the outputs of the smaller SRAMs. The decode logic 516 is part of the memory boundary logic. The decoder logic 516 selects between the outputs of the smaller SRAMs based upon the data on the upper 4 address bits. The 72 bit lines are connected to the inputs of all 16 smaller SRAMs. The bypass path 540 is common to all 16 SRAMs such that 72 collar flops 544 drive 72 bypass MUXes 514 when selected.

Although there are benefits to using multiple smaller memories to build a large memory, this arrangement makes it difficult to test for faults on the memory boundary logic. For example, many faults (including SAF and TF faults) in the memory decode logic 516 would remain untested as that logic is traditionally circumvented by the bypass path 540. The RAM sequential scan testing may also not be feasible for testing memory boundary logic faults due to deep combinational logic (e.g. memory decode logic and functional combinational logic combined together) on either side of the memory 510. As previously noted, the deep combinational logic makes it difficult for the ATPG tools to generate fault test vectors having responses which can successfully propagate through that combinational logic. For design for test (DFT) purposes, adding independent bypass logic to each smaller SRAM rather than the large SRAM so that the decode logic 516, for example, is not excluded, is typically not feasible since many additional flip-flops and MUXes would be required to implement. These additional elements would significantly increase the cost and area dedicated to elements which would only be used for testing the functional logic for faults.

In accordance with an embodiment of the present disclosure, the circuit 500 comprises a feedback path 550 connecting the output of the bypass MUXes 514 with the inputs of the collar flops 544 via exclusive-or gates 552. The feedback path 550 helps improve the testability of boundary logic in circuit paths comprising larger memories implemented using smaller memories. Avoiding propagating responses through the downstream combinational logic 526 by feeding them back to the collar flops 544 makes it feasible to include the memory 510 in the circuit path 520 during fault testing. This helps to sensitize faults on memory decode logic 516 and other memory boundary logic which would otherwise be excluded from testing if the collar flops 544 were used to bypass the memory 510 altogether. Higher test coverage of the actual functional circuit path 520 may be achieved by only adding to the chip exclusive-or gates 522 and nets to create the feedback path 520 without other more area-intensive elements.

Figure 6:
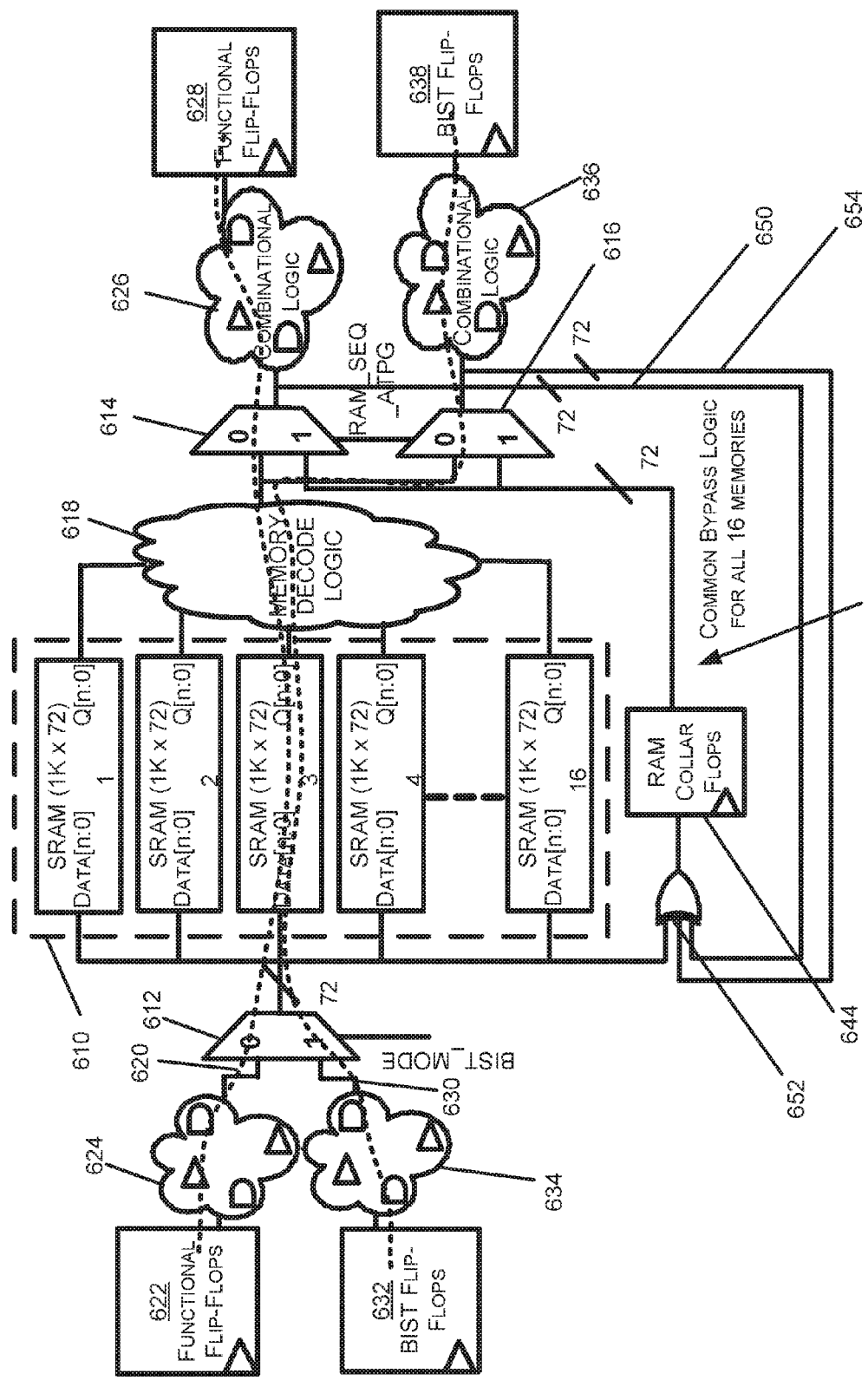
FIG. 6 shows a scan test architecture for a circuit comprising a plurality of memories in accordance with another embodiment of the present disclosure.

FIG. 6 shows a scan test architecture for a circuit 600 comprising a large memory 610 composed of a plurality of smaller memories in accordance with another embodiment of the present disclosure. The circuit 600 is similar to the circuit 400 of FIG. 4, except that the memory 608 comprises a plurality of smaller memories, and the circuit 600 comprises memory decode logic 618.

As discussed in relation to FIG. 4, distant placed downstream BIST combinational logic 638 may negatively affect the timing of the functional-SRAM interface due to routing length. Separate groups of bypass MUXes 614, 616 for functional and BIST circuit paths 620, 630 may be included in the circuit 600 to address this timing issue. Typically, the inputs to the BIST MUXes 612 would be untestable due to the deep combinational logic on the BIST circuit path 620. The testability of the BIST MUXes 612 may actually worsen because the memory 610 comprises smaller memories the elements of which add to the combinational logic.

In accordance with an embodiment of the present disclosure, the outputs from both groups of bypass MUXes 614, 616 are fed back to the collar flops 644 via a first and a second feedback path 650, 654.

The subject matter of the present disclosure does not dependent on the scan chain implementation. As such, the methods and systems of the present subject matter may be used with various advanced scan mechanisms, including but not limited to: SAF testing; TF and path delay scan testing; scan compression (e.g. "Illinois" architecture); and hierarchical or macro-based scan implementations.

Table 1 compares chip fault test coverage percentages resulting from the use of a conventional circuit, and a circuit comprising a feedback path in accordance with the embodiments of the present disclosure. Eight hierarchical blocks of varying block instances were tested as shown in Table 1. Overall, about 1 million additional potential faults were tested for the targeted chip, with a 0.65% fault test coverage improvement at a chip level, resulting from the use of a feedback path in accordance with an embodiment of the present disclosure as compared to using a conventional circuit without the feedback path.

TABLE 1

| Block | Conventional Circuit (%) | Circuit with feedback path in accordance with an embodiment of present disclosure (%) | Block Instances |
| --- | --- | --- | --- |
| Block 1 | 98.18 | 99.40 | 16 |
| Block 2 | 99.13 | 99.85 | 1 |
| Block 3 | 97.65 | 99.01 | 1 |
| Block 4 | 99.36 | 99.45 | 16 |
| Block 5 | 99.31 | 99.52 | 1 |
| Block 6 | 98.52 | 99.53 | 1 |
| Block 7 | 98.87 | 99.52 | 8 |
| Block 8 | 99.51 | 99.80 | 2 |
| CHIP LEVEL | 98.88 | 99.53 | |

Thus, the methods and systems of the present disclosure may help increase both SAF and TF coverage. Using the bypass flop for scan capture and a feedback mechanism has minimal impact on area overhead of the chip. Overall, product quality may be improved by efficiently screening timing/marginal defects in the memory boundary logic. The methods and systems of the present disclosure may also improve testability of SRAM architecture for larger logical memories made from smaller physical memories that have deep combinational logic due to memory decode logic, functional logic cones and BIST logic cones.

The methods and systems of the present disclosure may also improve testability of SRAM architecture for functional & BIST bypass MUX cloning. For example, memory outputs from dual port memories having two sets of control/address/data ports along with their respective outputs may be aggregated into a respective bypass flop, so that testability on interface of both the ports increased.

The methods and systems of the present disclosure may also improve testability of back-to-back connected memories by treating them as a single memory for memory output capture. A back-to-back memory may be one memory connected directly to another memory.

The methods and systems of the present disclosure may be applicable to any system-on-chip (SOC) design consisting of SRAMs, where the SOC needs improved test coverage (both SAF and TF) of the functional logic cones around the SRAMs using existing scan testing methods with commercial ATPG tools. The methods and systems of the present disclosure may also be applicable to SOCs that require better quality fault test vectors to test the speed of the memory boundary logic.

The methods and systems of the present disclosure may provide higher SAF and TF coverage on timing critical memory interface paths, so that the chip is structurally screened for defects before shipping.

In the preceding description, for purposes of explanation, numerous details are set forth in order to provide a thorough understanding of the embodiments of the disclosure. However, it will be apparent to one skilled in the art that these specific details are not required. In other instances, well-known electrical structures and circuits are shown in block diagram form.

The above-described embodiments are intended to be examples only. Alterations, modifications, and variations may be effected to the particular embodiments by those of skill in the art without departing from the scope, which is defined solely by the claims appended hereto.

What is claimed is:

1. A circuit, comprising:
    a memory comprising a memory input and a memory output;
    a bypass path in parallel with the memory, the bypass path comprising a collar flop in communication with the memory input and the memory output, a first net connecting the memory input to an input of the collar flop and a second net connecting the output of the collar flop to logic downstream of the memory; and
    a feedback path connecting the memory output to an input of the collar flop, the collar flop configured to capture, from the feedback path, a fault test vector response.

2. The circuit of claim 1, further comprising an exclusive-or (XOR) gate in communication with the memory and the feedback path, the XOR gate configured to aggregate, for input into the collar flop, data received at the memory input with the fault test vector response in the feedback path.

3. The circuit of claim 1, further comprising memory boundary logic in communication with the memory, wherein the first net connects the input of the collar flop upstream of the memory boundary logic located upstream of the input of the memory and the second net connects the output of the collar flop to logic downstream of the memory boundary logic located downstream of the output of the memory, such that the bypass path excludes the memory and the memory boundary logic.

4. The circuit of claim 3, wherein the collar flop is configured to capture the fault test vector response resulting from the memory boundary logic performing operations on a fault test vector.

5. The circuit of claim 3, wherein the memory boundary logic comprises at least one of first combinational logic configured to control the memory, second combinational logic configured to encode data received by the memory, third combinational logic configured to decode data from the memory, a memory input port, and a memory output port.

6. The circuit of claim 3, wherein the memory boundary logic comprises a first multiplexor (MUX) configured to select between the memory output and an output of the collar flop, and wherein an output of the first MUX is in communication with the feedback path.

7. The circuit of claim 3, wherein
    the memory boundary logic comprises a first MUX and a second MUX, each of the first and second MUXes configured to select between the memory output and the output of the collar flop;
    the feedback path comprises a first feedback path and a second feedback path;
    the output of the first MUX is connected to the first feedback path; and
    the output of the second MUX is connected to the second feedback path.

8. The circuit of claim 3, wherein the memory comprises a plurality of memories, and wherein the memory boundary logic comprises combinational logic configured to decode the output of the plurality of memories.

9. The circuit of claim 1, wherein the fault test vector response is a stuck-at fault response or a transition fault response.

10. The circuit of claim 1, further comprising upstream combinational logic in communication with the memory input, and downstream combinational logic in communication with the memory output.

11. The circuit of claim 1, wherein the memory comprises a static random access memory (SRAM) or a test-wrapped memory.

12. The circuit of claim 2, further comprising an AND gate between the memory input and the XOR gate, the AND gate configured to cause the fault test vector response to propagate through the feedback path.

13. A method for testing for a fault in a circuit the method comprising:
    applying a fault test vector to a logic in the circuit to produce a fault test vector response,
    propagating the fault test vector or the fault test vector response, in parallel, through both a memory in the circuit and a bypass path, the memory having a memory input and a memory output, and the bypass path having a first net connecting the memory input to an input of a collar flop and a second net connecting the output of the collar flop to logic downstream of the memory;
    capturing the fault test vector response output by the memory in the collar flop by passing the fault test vector response output by the memory to the collar flop via a feedback path;
    shifting the fault test vector response out of the collar flop; and
    comparing the fault test vector response output by the memory and captured in the collar flop to an ideal response to identify a fault.

14. The method of claim 13, wherein propagating the fault test vector or the fault test vector response through the memory comprises writing the fault test vector or the fault test vector response into the memory, and reading the fault test vector or the fault test vector response from the memory.

15. The method of claim 13, wherein when the logic is upstream from the memory, the fault test vector response is propagated through the memory.

16. The method of claim 13, wherein when the logic is downstream from the memory, the fault test vector is propagated through the memory.

17. The method of claim 13, wherein the fault test vector is a stuck-at-fault test vector or a transition-fault test vector.

18. The method of claim 13, wherein the logic is sensitized at an operational speed.

19. The method of claim 13, wherein the fault test vector response is produced in response to applying the fault test vector to memory boundary logic, wherein the first net connects the input of the collar flop upstream of the memory boundary logic located upstream of the input of the memory and the second net is connected to logic downstream of the memory boundary logic located downstream of the output of the memory, such that the bypass path excludes the memory and the memory boundary logic.

* * * * *